United States Patent
Grötsch et al.

(10) Patent No.: US 6,353,202 B1
(45) Date of Patent: Mar. 5, 2002

(54) APPARATUS AND METHOD FOR PRODUCING A CHIP-SUBSTRATE CONNECTION

(75) Inventors: Stefan Grötsch, Regensburg; Hans-Ludwig Althaus, Lappersdorf; Werner Späth, Holzkirchen; Georg Bogner, Hainsacker, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/491,117

(22) Filed: Jan. 24, 2000

Related U.S. Application Data

(63) Continuation of application No. PCT/DE98/02027, filed on Jul. 20, 1998.

(51) Int. Cl.$^7$ .............................................. B23K 26/20
(52) U.S. Cl. ........................... 219/121.63; 219/121.64; 228/180.22
(58) Field of Search .................. 219/121.63, 121.64, 219/121.82; 228/234.1, 180.22

(56) References Cited

U.S. PATENT DOCUMENTS

| | | | |
|---|---|---|---|
| 5,262,355 A | * 11/1993 | Nishiguchi et al. | |
| 5,481,082 A | 1/1996 | Yamamoto et al. | .... 219/121.64 |
| 5,743,901 A | * 4/1998 | Grove et al. | |
| 5,829,125 A | * 11/1998 | Fujimoto et al. | ...... 219/121.64 |
| 5,946,597 A | * 8/1999 | Miura et al. | ............ 228/180.22 |

FOREIGN PATENT DOCUMENTS

| | | |
|---|---|---|
| DE | 214493 | 10/1984 |
| DE | 3001613 C2 | 4/1986 |
| DE | 4234342 | * 4/1994 |
| EP | 0321142 A2 | 6/1989 |
| GB | 2244374 A | 11/1991 |

OTHER PUBLICATIONS

IBM Technical Disclosure Bulletin XP–002086307, vol. 24, No. 8, Jan. 1982.
IBM Technical Disclosure Bulletin XP–002086308, vol. 22, No. 2, Jul. 1979.

* cited by examiner

*Primary Examiner*—Geoffrey S. Evans
(74) *Attorney, Agent, or Firm*—Herbert L. Lerner; Laurence A. Greenberg; Werner H. Stemer

(57) ABSTRACT

An apparatus for producing a chip-substrate connection, in particular by soldering a semiconductor chip on a substrate. The apparatus has a support, on which the substrate is temporarily supported, and a heating device which is provided for forming the chip-substrate connection. The heating device has a radiation source in the form of a laser in the infrared wavelength range. The support is formed by a heat body, which is assigned to the chip-substrate connection and is heated with thermal radiation by the radiation source. A surface of the heat body is coated with a material, in particular a material containing chromium, exhibiting high absorption with respect to the light radiation emitted by the radiation source.

20 Claims, 1 Drawing Sheet

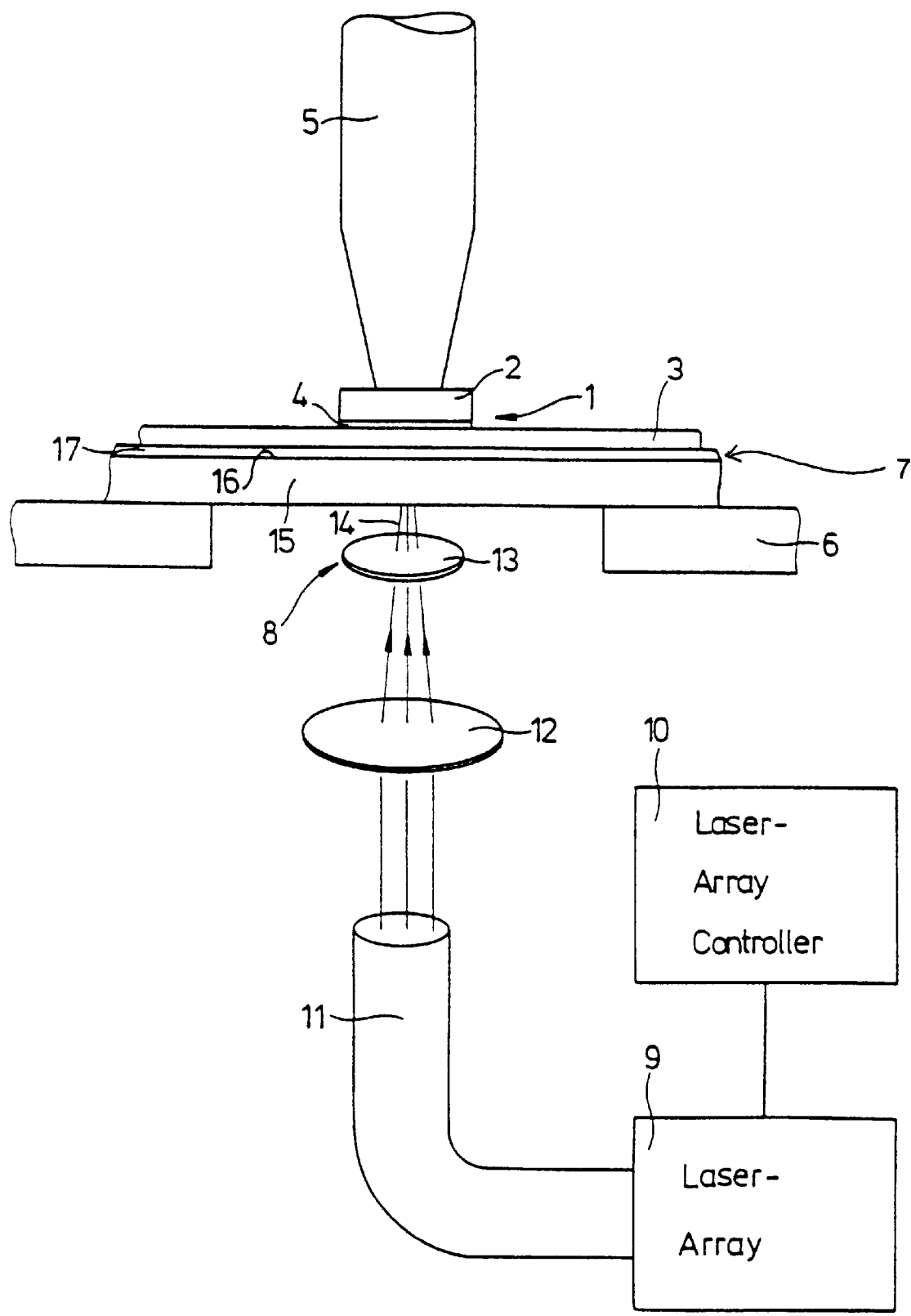

APPARATUS AND METHOD FOR PRODUCING A CHIP-SUBSTRATE CONNECTION

CROSS-REFERENCE TO RELATED APPLICATION

This is a continuation of copending International Application PCT/DE98/02027, filed Jul. 20, 1998, which designated the United States.

BACKGROUND OF THE INVENTION

Field of the Invention

The invention relates to an apparatus and a method for producing a chip-substrate connection, in particular by soldering a semiconductor chip on a substrate, which apparatus has a support, on which the substrate is temporarily supported, and a heating device assigned to the chip-substrate connection.

When a rear side of a semiconductor chip is connected to a substrate, which is usually referred to as chip or die bonding, the requirements with regard to sufficient mechanical fixing and also good thermal and electrical conductivity must be fulfilled individually or jointly, depending on the application. An important factor is the compatibility of the chip and the substrate, that is to say the matching of the two participants in the connection in terms of their expansion behavior under thermal loading. At the present time, essentially three distinguishable methods of chip fixing are customary: alloying (hard soldering), soldering (soft soldering), and bonding. The preferred area of application according to the present invention is soldering (soft soldering), in the case of which method principle, in contrast for instance to eutectic Si/Au hard soldering for the chip fixing, no silicon of the chip goes into the solution. Rather, in the course of soft soldering at temperatures distinctly below 450° Celsius and thus also again significantly below the melting point of the metals involved, the metallized participants in the connection are wetted by melting solder and then connected. Although the temperatures that occur in the course of soft soldering allow the method to be applied to all customary substrates, it is preferably applied to metallic lead frames and ceramic housing bases. In general, in the case of chip fixing by soldering, matching in terms of the thermal expansion behavior of the participants in the connection is desired, but the limits are set more widely than in the case of alloying.

An untreated rear side of the chip cannot normally be wetted by soft solder, this must be metallized. In addition to the requirement, applicable in this case as well, for good adhesion on the silicon and a junction free of a depletion layer, there is also the requirement for good solderability, that is to say wettability. Thus, for junctions which are free of a depletion layer, principally solders containing Ti, NiSi and AuSb have proved worthwhile on n-Si layers and solders containing Al, Cr and Au on p-Si layers. The substrate surface is usually nickel-plated by chemical methods. If low soldering temperatures are desired, silver electroplating can also be considered.

Resistance-heated soldering receptacles or heating windings have been used hereto for as heating sources for heating the semiconductor chips and materials to be connected. However, the heating sources have the disadvantage that their rate of heating up to the soldering temperature is too long (generally significantly longer than 1 s), with the result that oxidation of the solder takes place and, consequently, it is necessary to use protective gases or reducing atmospheres.

Published, European Patent Application EP 321 142 A2 discloses a diode laser-assisted soldering method in which a heating element which engages around the parts to be connected in a bell-shaped manner and is made of a material that absorbs laser radiation is provided. The heating element is heated by irradiation with laser light and outputs thermal energy to the parts to be connected. The heating element is not in direct mechanical contact with the parts to be connected, rather openings are provided which ensure sufficient circulation of air.

Published, British Patent Application GB 2,244,374 A discloses a method for the laser-assisted soldered connection of a semiconductor wafer substrate and of an integrated circuit in which the infrared radiation of the laser is directed through the wafer substrate directly at the connection to be soldered.

Further laser-assisted or radiation-assisted soldering methods have been disclosed in IBM TBD vol. 22 No. Jul. 2, 1979 and IBM TDB vol. 24 No. Jan. 8, 1982.

SUMMARY OF THE INVENTION

It is accordingly an object of the invention to provide an apparatus and a method for producing a chip-substrate connection which overcome the above-mentioned disadvantages of the prior art methods and devices of this general type.

With the foregoing and other objects in view there is provided, in accordance with the invention, an apparatus for producing a connection, including:

a heating device for forming a chip-substrate connection, containing:
   a support for temporarily supporting a substrate with a semiconductor chip disposed thereon, the support having a heat body that can be heated by electromagnetic radiation, the heat body being thermally intimately coupled to the substrate; and
   a radiation source supplying the electromagnetic radiation to the heat body for connecting the semiconductor chip to the substrate.

The invention is based on the object of specifying an apparatus and a method for producing a chip-substrate connection, in particular by soft soldering for fixing a semiconductor chip on a substrate such as, for example, a metallic lead frame or ceramic housing base, in which heating up for the purpose of producing the soldered connection to more than, typically, 350° Celsius is enabled in a very short time, that is to say approximately 1 s or less, and, at the same time, of keeping the thermal loading on the affected semiconductor chip as low as possible.

The invention provides for the heating device to have a radiation source, and for the support for supporting the substrate to have, as part of the heating device, a heat body, which is assigned to the chip-substrate connection and is heated with electromagnetic radiation by the radiation source during the operation of the apparatus. Following the principle of the invention, it is provided that the radiation source constitutes a laser outputting laser radiation in the infrared wavelength range.

By comparison with the heating sources used heretofore in the case of soft soldering for chip fixing, the invention affords, in particular, the below recited advantages.

The use of laser radiation in the infrared wavelength range typically around 950 nm results in that the soldered connection of the semiconductor chip and the substrate can be heated up to more than approximately 350° Celsius in a very short time, that is to say typically in approximately 1 s or less. The laser power used being chosen appropriately in accordance with the heat body heated with the thermal radiation, in such a way that the heat body exhibits sufficiently high absorption of the laser radiation in order that the infrared light energy can be converted into thermal energy, but on the other hand the laser power is not so high that the semiconductor chip to be connected is exposed to excessively great thermal loading.

Oxidation of the solder is avoided as a result of the very high rates of heating up to the soldering temperature, with the result that it is possible to work even without the use of protective gases or reducing atmospheres. The use of soldering fluxes can be obviated on account of the very short time intervals until the soldering temperatures are reached.

The brief heating can be effected in an approximately spot-type manner and thus in a chip-by-chip manner, with the result that only the respectively affected semiconductor chip for producing the soldered joint is heated in a controlled manner, and the semiconductor chips adjacent to it do not yet experience any significant temperature increase.

The term "chip-substrate connection" should be understood to be not only connections of individual chips cut or sawn from the wafer composite but also connections of a plurality of still contiguous semiconductor chips from the wafer composite, so-called chip ingots.

It is advantageously provided that the heat body, assigned to the chip-substrate connection, of the heating device has a material that is transparent or at least translucent to the thermal radiation from the radiation source. Quartz as the preferred material for the heat body has the advantage, on account of its low degree of expansion, that short, locally occurring temperature fluctuations do not lead to cracks or breaks.

Following the principle of the invention, it is furthermore provided that on its side facing the chip-substrate connection the heat body has a material exhibiting high absorption of the light radiation fed by the radiation source. The material exhibiting high absorption is particularly advantageously provided as a thin metal layer coating, in particular a thin chromium layer, on that surface of the heat body that faces the chip-substrate connection. In the case of a transparent heat body such as quartz, for example, the thickness of the applied chromium layer is advantageously a few 100 nm, at most up to approximately a few $\mu$m, or more, provided that there are no problems to be expected with regard to sufficient adhesion of the chromium layer on the heat body. The material exhibiting high laser absorption on the heat body affords, according to the invention, above all the advantage of achieving sufficiently high absorption of the laser radiation in order to convert the infrared light energy into thermal energy. At the same time, the good absorption of this material results in that it is possible to reduce the laser power used, thereby opening up, in turn, the use of the already available, particularly well suited laser sources such as, in particular, semiconductor laser diodes for producing a chip-substrate connection according to the invention.

In the case of a heat body coated with the laser absorption material, the heat body itself should be a poor heat conductor and ideally transparent to the laser radiation, or, in the case of good thermal conductivity, should have a sufficiently low thermal capacity. In this way, the proportion of energy not used for heating up the primary materials can be kept low in both cases. In this sense, too, preference is given to a heat body made of quartz that is provided with a chromium layer serving as an energy absorber.

Particularly advantageously, it may be provided that the extent of the material exhibiting high absorption is limited to that section of the directly affected semiconductor chip of the chip-substrate connection that is to be heated. This opens up the possibility of bonding the chips individually without unnecessarily heating up adjacent chips.

Other features which are considered as characteristic for the invention are set forth in the appended claims.

Although the invention is illustrated and described herein as embodied in an apparatus and a method for producing a chip-substrate connection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, partial, sectional view of an apparatus for producing a chip-substrate connection by soft soldering a semiconductor chip using an IR laser source according to the invention.

DESCRIPTION OF THE PREFERRED EMBODIMENTS

Referring now to the single FIGURE of the drawing in detail, there is shown an exemplary embodiment containing an apparatus according to the invention for producing a chip-substrate connection 1 by soft soldering an individual semiconductor chip 2 on a substrate 3. For the sake of simplicity, the reference symbol 4 schematically designates all of the materials necessary on a rear side of the semiconductor chip 2 for producing the chip-substrate connection, that is to say soft solder and, if appropriate, further solderable covering layers. The substrate 3 serving as a mount for the fixing of the semiconductor chip 2 is likewise merely indicated schematically and partially in the FIGURE; a prefabricated metal lead frame is illustrated, this being a very widespread form of substrate particularly for use in plastic housings. The substrate 3 is normally fed in continuous form from a metal strip to the apparatus for producing the chip-substrate connection. An individual semiconductor chip is removed, by a specially shaped suction plunger 5, from a bonding sheet (not specifically illustrated) on which the chip 2 was bonded as a wafer for sawing purposes, and is positioned and deposited on that location on the substrate 3 which is provided for it, as indicated in the figure. Afterwards, the semiconductor chip 2 and the substrate 3 are connected by soft soldering by the apparatus according to the invention. The apparatus includes a support 7, which is fixed on a table 6 and on which the substrate 3 is temporarily supported, and also a heating device 8 for forming the chip-substrate connection 1.

According to the invention, the heating device 8 includes an infrared laser radiation source 9, preferably a semiconductor laser diode, which is controlled by an electrically coupled controller 10 and whose laser radiation with a wavelength of approximately 950 nm is guided via an optical waveguide 11 and optical focusing lenses 12, 13 to a heat body 15 that is to be heated with light radiation 14. The heat body 15 contains a quartz plate provided with a chromium layer 17, having a thickness of from 100 nm to approximately 300 nm, on its surface 16 facing the chip-substrate connection 1. In this case, the chromium layer 17 serves, as an absorber layer, for absorbing the laser radiation 15 fed in, converts the radiant infrared light energy received into thermal energy and passes it onto the substrate 3, which is thermally intimately coupled to the heat body 15, and thus to the soldering agent 4. According to an essential concept of the invention, the support 7 supporting the substrate 3 is thus simultaneously configured as part of the heating device 8, that is to say it constitutes the heat body 15 heated with the thermal radiation from the laser radiation source 9. The apparatus according to the invention makes it possible for just the component parts that are to be connected, that is to say the semiconductor chip 2 and substrate 3, to be brought to the desired soldering temperature of somewhat more than 350° C. in an extremely short time intervals typically of less than 1 s. At the same time, that proportion of the energy of the laser 9 which is not used for heating up the component parts to be connected can be kept as low as possible. As an alternative, a heating source of a previously known configuration may be provided for the purpose of preheating, but it is not specifically illustrated in the figure.

We claim:

1. An apparatus for producing a connection, comprising:
   a heating device for forming a chip-substrate connection, including:
      a support for temporarily supporting a substrate with a semiconductor chip disposed thereon, said support having a heat body that can be heated by electromagnetic radiation, said heat body being thermally intimately coupled to the substrate; and
      a radiation source supplying said electromagnetic radiation to said heat body for connecting the semiconductor chip to the substrate.

2. The apparatus according to claim 1, wherein said heat body includes a first layer and a second layer, said first layer being formed of a material selected from the group consisting of transparent materials and materials that are at least translucent to the electromagnetic radiation from the radiation source, and said second layer being formed of an absorbent material.

3. The apparatus according to claim 2, wherein said heat body is formed of quartz.

4. The apparatus according to claim 1, wherein said radiation source is a laser outputting laser radiation in an infrared wavelength range.

5. The apparatus according to claim 4, wherein the laser radiation has a wavelength of approximately 950 nm.

6. The apparatus according to claim 4, wherein said heat body has a side facing the chip-substrate connection formed of a material exhibiting high absorption of the laser radiation fed by said laser.

7. The apparatus according to claim 6, wherein said side of said heat body facing the chip-substrate connection is coated with said material exhibiting the high absorption with respect to said laser radiation emitted by said radiation source.

8. The apparatus according to claim 6, wherein said material is a thin chromium layer disposed on said side of said heat body facing the chip-substrate connection.

9. The apparatus according to claim 6, wherein an extent of said material exhibiting the high absorption is limited to a section of said heat body corresponding to an area of the semiconductor chip forming the chip-substrate connection.

10. The apparatus according to claim 1, wherein the chip-substrate connection is a solder connection.

11. A method for producing a connection, comprising:
    providing a heating device having a support for temporarily holding a substrate with a semiconductor chip disposed thereon, the support being a heatable body thermally and intimately coupled to the substrate;
    using a radiation source of the heating device for outputting an electromagnetic radiation received by the heatable body for connecting the semiconductor chip to the substrate and forming a chip-substrate connection.

12. The method according to claim 11, which comprises providing the heatable body on a first side with a material which is selected from the group consisting of transparent materials and materials that are at least translucent to the electromagnetic radiation from the radiation source; and
    providing the heatable body on a second side with an absorbent material.

13. The method according to claim 12, which comprises forming the heatable body with quartz.

14. The method according to claim 11, which comprises setting a wavelength of the laser radiation to be approximately 950 nm.

15. The method according to claim 11, which comprises embodying the radiation source as a laser outputting laser radiation in an infrared wavelength range.

16. The method according to claim 15, which comprises providing the heatable body on a side facing the chip-substrate connection with a material exhibiting high absorption of the laser radiation fed by the radiation source.

17. The method as claimed in claim 16, which comprises coating the side of the heatable body which faces the chip-substrate connection with the material exhibiting the high absorption with respect to the laser radiation emitted by the radiation source.

18. The method according to claim 16, which comprises forming the material disposed on the side of the heatable body facing the chip-substrate connection as a thin chromium layer.

19. The method according to claim 16, which comprises forming an extent of the material exhibiting the high absorption to be limited to that section of the heatable device corresponding to the area of the semiconductor chip.

20. The method according to claim 11, which comprises forming the chip-substrate connection as a solder connection.

* * * * *

UNITED STATES PATENT AND TRADEMARK OFFICE
CERTIFICATE OF CORRECTION

PATENT NO. : 6,353,202 B1
DATED : March 5, 2002
INVENTOR(S) : Stefan Grötsch et al.

It is certified that error appears in the above-identified patent and that said Letters Patent is hereby corrected as shown below:

<u>Title page,</u>
Item [30], should read as follows:

-- July 23, 1997      (DE) ......... 197 31 740 --

Signed and Sealed this

Twenty-seventh Day of August, 2002

Attest:

JAMES E. ROGAN
Attesting Officer     Director of the United States Patent and Trademark Office